(12) United States Patent
Scheler et al.

(10) Patent No.: US 6,630,703 B2
(45) Date of Patent: Oct. 7, 2003

(54) MAGNETORESISTIVE MEMORY CELL CONFIGURATION AND METHOD FOR ITS PRODUCTION

(75) Inventors: Ulrich Scheler, Dresden (DE); Siegfried Schwarzl, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/940,011

(22) Filed: Aug. 27, 2001

(65) Prior Publication Data

US 2002/0041514 A1 Apr. 11, 2002

Related U.S. Application Data

(63) Continuation of application No. PCT/DE00/00305, filed on Feb. 1, 2000.

(30) Foreign Application Priority Data

Feb. 26, 1999 (DE) .......................... 199 08 518

(51) Int. Cl.[7] .................................. H01L 31/062
(52) U.S. Cl. ..................... 257/295; 257/758; 257/421
(58) Field of Search ..................... 257/295, 758; 365/158, 173

(56) References Cited

U.S. PATENT DOCUMENTS

| | | | | |
|---|---|---|---|---|
| 5,587,943 A | * | 12/1996 | Torok et al. ................ | 365/158 |
| 5,861,328 A | | 1/1999 | Tehrani et al. .............. | 438/210 |
| 5,915,167 A | * | 6/1999 | Leedy ......................... | 438/108 |
| 5,920,500 A | * | 7/1999 | Tehrani et al. .............. | 365/173 |
| 6,111,729 A | * | 8/2000 | Kamiguchi et al. ........ | 360/324.1 |

FOREIGN PATENT DOCUMENTS

| | | |
|---|---|---|
| DE | 197 26 852 A1 | 2/1998 |
| WO | WO 00/52701 | 9/2000 |

OTHER PUBLICATIONS

Hu, Y.Z. et al.: "Chemical–mechanical polishing as an enabling technology for giant magnetoresistance devices", Thin Solid Films, vol. 308–309, No. 104, Oct. 31, 1997, pp. 555–561.

* cited by examiner

*Primary Examiner*—David Nelms
*Assistant Examiner*—Tu-Tu Ho
(74) *Attorney, Agent, or Firm*—Laurence A. Greenberg; Werner H. Stemer; Ralph E. Locher

(57) ABSTRACT

A storage cell configuration including magnetoresistive storage elements located in a cell field between first lines and second lines. A first metalization plane, a second metalization plane and contacts connecting the first metalization plane to the second metalization plane are provided in a periphery. The first lines and the first metalization plane and the second lines and the contacts are disposed on the same plane respectively so that they can be produced by structuring one conductive layer respectively.

8 Claims, 9 Drawing Sheets

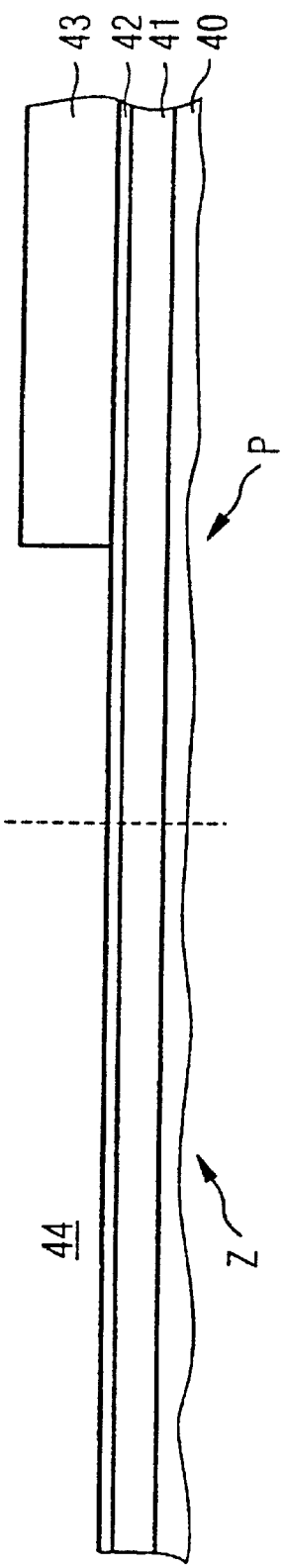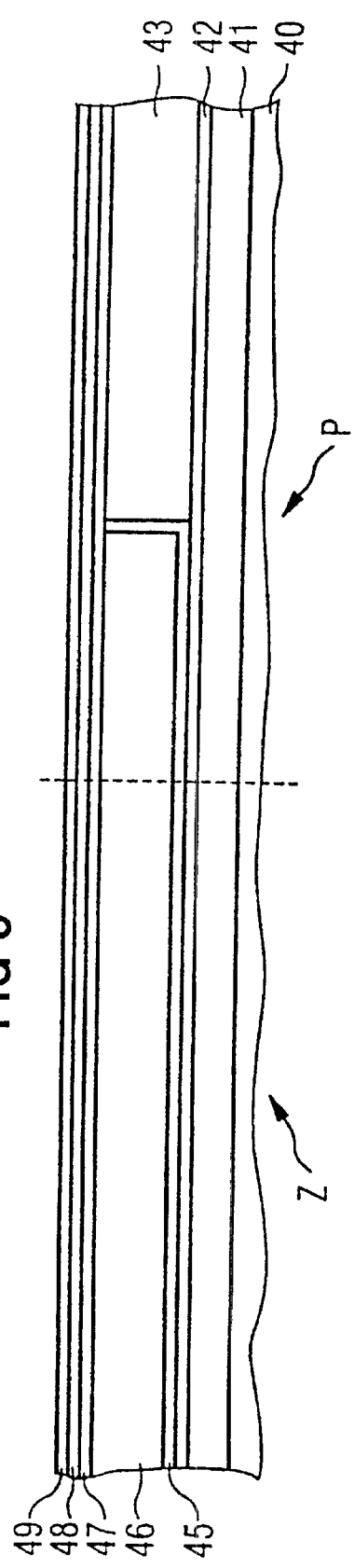

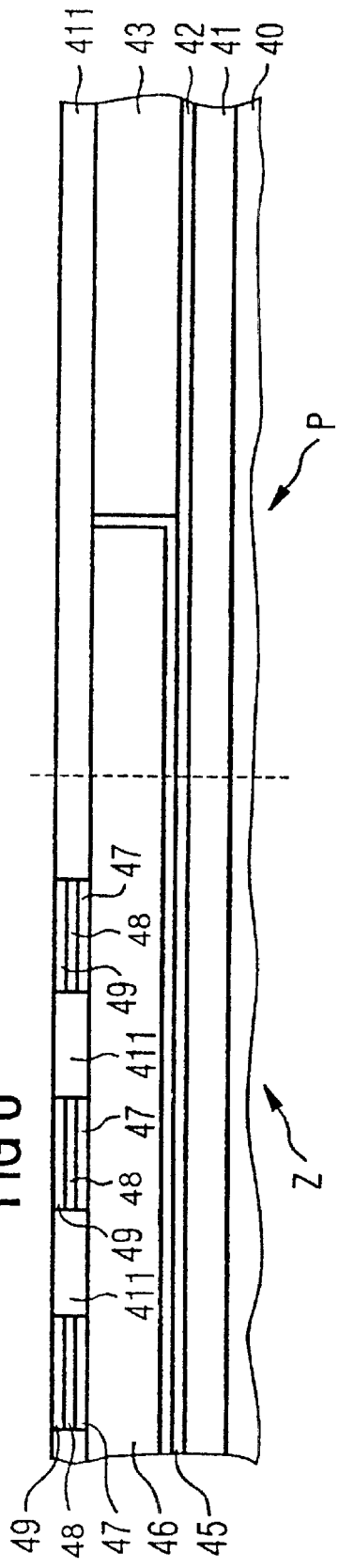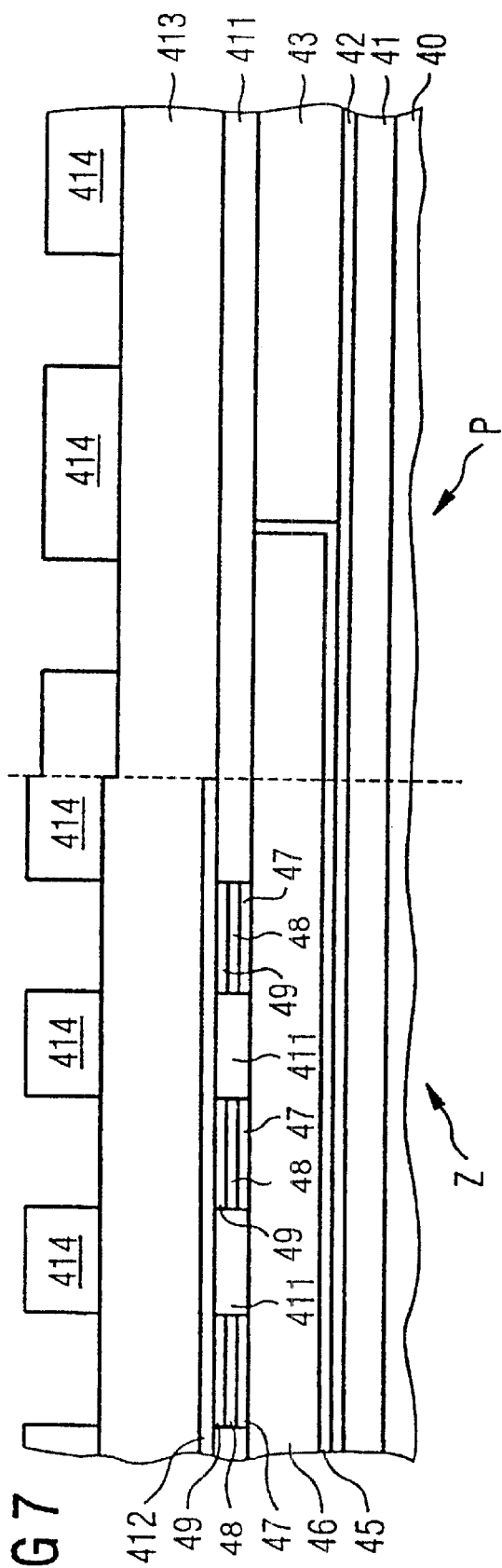

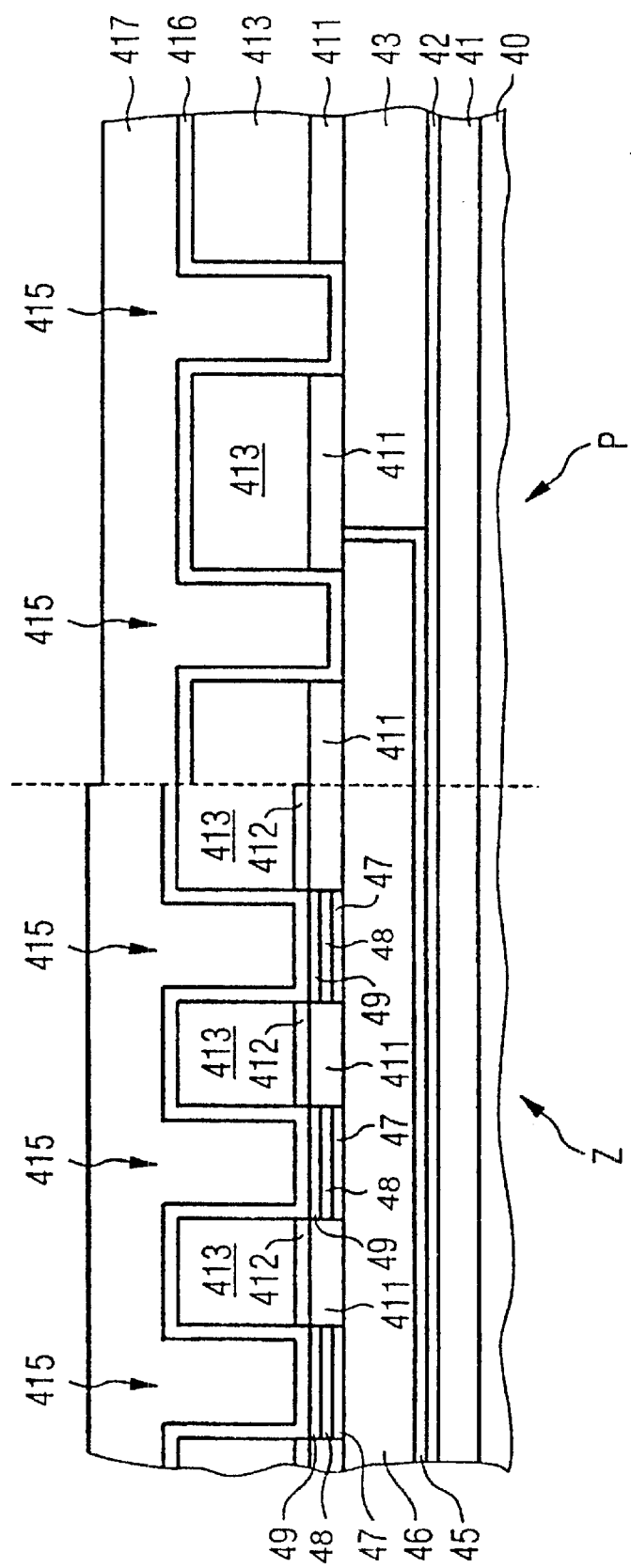

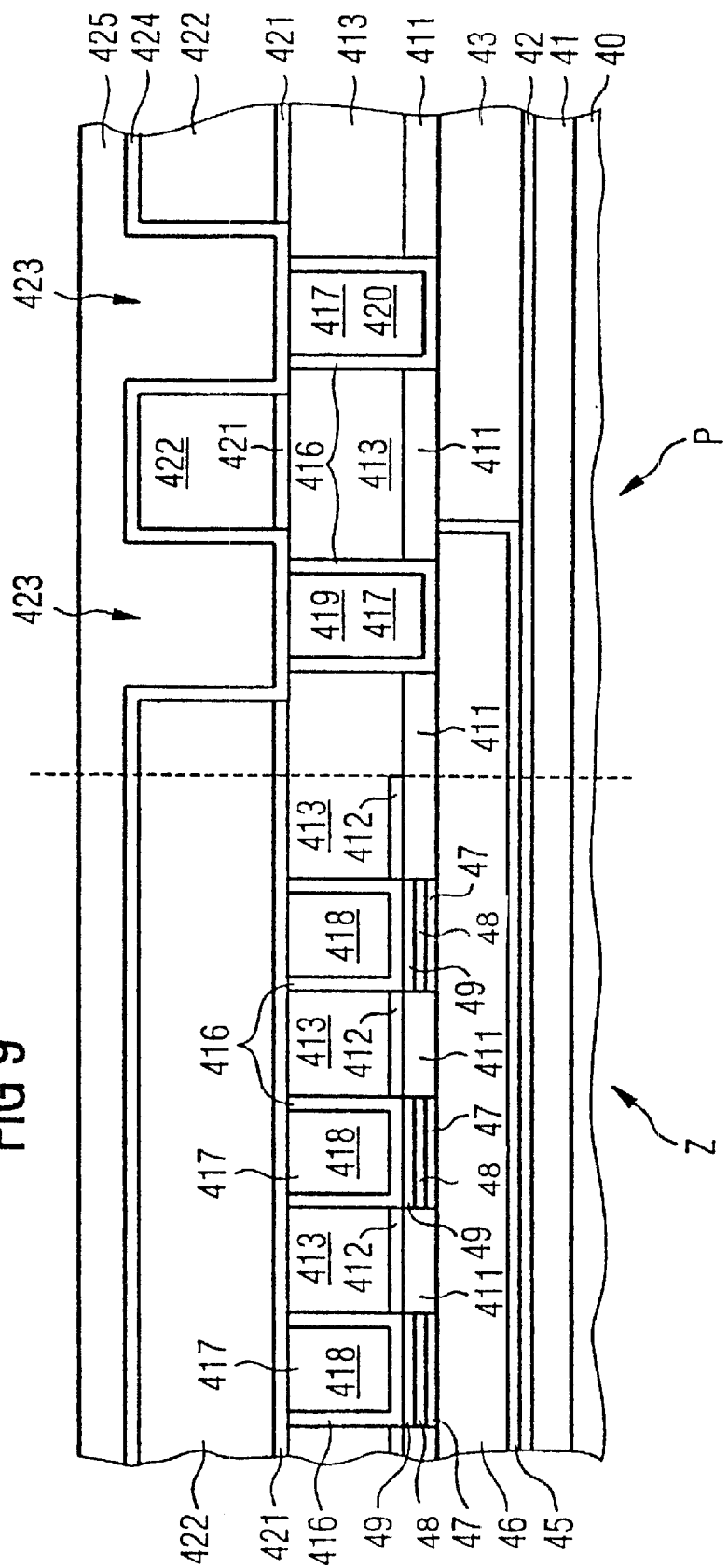

MAGNETORESISTIVE MEMORY CELL CONFIGURATION AND METHOD FOR ITS PRODUCTION

CROSS-REFERENCE TO RELATED APPLICATION

This application is a continuation of copending International Application No. PCT/DE00/00305, filed Feb. 1, 2000, which designated the United States.

BACKGROUND OF THE INVENTION

Field of the Invention

The present invention relates to a memory cell configuration having a magnetoresistive memory element, and to a method for producing a memory cell configuration having a magnetoresistive memory element.

In the prior art, the expression magnetoresistive element means a structure which has at least two ferromagnetic layers and a non-magnetic layer disposed in between them. Depending on the construction of the layer structure, a distinction is in this case drawn between a GMR element, a TMR element and a CMR element (see S. Mengel, Technologieanalyse Magnetismus, Band 2, XMR-Technologien, Herausgeber VDI Technologiezentrum Physikalische Technologien [Technological analysis of magnetism, Volume 2, XMR technologies, issued by VDI Technology Center for Physical Technologies], August 1997).

The term GMR element is used for layer structures which have at least two ferromagnetic layers and a non-magnetic, conductive layer disposed in between them and which have what is referred to as a GMR (giant magnetoresistive) effect. The expression GMR effect refers to the fact that the electrical resistance of the GMR element is dependent on whether the magnetization directions in the two ferromagnetic layers are aligned parallel in the same direction or in opposite directions. In comparison to what is referred to as the AMR (anisotropic magnetoresistive) effect, the GMR effect is large. The AMR effect refers to the fact that the resistance in magnetic conductors differs parallel to and at right angles to the magnetization direction. The AMR effect is a volume effect which occurs in single ferromagnetic layers.

In the prior art, the term TMR element is used for tunneling magnetoresistive layer structures, which have at least two ferromagnetic layers and an insulating, non-magnetic layer disposed in between them. The insulating layer is in this case sufficiently thin to allow a tunneling current to flow between the two ferromagnetic layers. These layer structures likewise have a magnetoresistive effect, which is produced by a spin-polarized tunneling current through the insulating, non-magnetic layer disposed between the two ferromagnetic layers. In this case as well, the electrical resistance of the TMR element is dependent on whether the magnetization directions in the two ferromagnetic layers are disposed parallel in the same direction or in opposite directions. The relative resistance change is in this case from approximately 6% to approximately 40%.

A further magnetoresistive effect, which is referred to as the colossal magnetoresistive effect (CMR effect) owing to its magnitude (relative resistance change of 100 to 400% at room temperature) requires a strong magnetic field to switch between the magnetization states, owing to its high coercivity forces.

It has been proposed (see, for example, D. D. Tang et al., IEDM 95, pages 997 to 999, J. M. Daughton, Thin Solid Films, Volume 216 (1992), pages 162 to 168, Z. Wang et al, Journal of Magnetism and Magnetic Materials, Vol. 155 (1996), pages 161 to 163) for GRM elements to be used as memory elements in a memory cell configuration. The memory elements are connected in series via read lines. Word lines run transversely with respect to these read lines and are insulated both from the read lines and from the memory elements. Signals applied to the word lines result in a current flowing in the word line which produces a magnetic field, which influences the memory elements located underneath it, if its intensity is sufficient. Information written using x/y lines, which cross at the memory cell to be written to. Signals are applied to them and cause a magnetic field, which is sufficient for remagnetization, at the crossing point. In the process, the magnetization direction in one of the two ferromagnetic layers is switched. The magnetization direction in the other of the two ferromagnetic layers remains unchanged, however. The fixing of the magnetization direction in the last-mentioned ferromagnetic layer is achieved by using an adjacent antiferromagnetic layer, which fixes the magnetization direction, or by the switching threshold for this ferromagnetic layer being increased by using a different material or different dimensions, for example by increasing the layer thickness in comparison to that of the first-mentioned ferromagnetic layer.

Annular memory elements which are based on the GMR effect have been proposed in U.S. Pat. No. 5,541,868 and U.S. Pat. No. 5,477,483. A memory element including a stack which has at least two annular ferromagnetic layer elements and a nonmagnetic conductive layer element which is disposed between them, and which is connected between two lines. The ferromagnetic layer elements have different material compositions. One of the ferromagnetic layer elements is magnetically hard, and the other is magnetically softer. In order to write information, the magnetization direction in the magnetically softer layer element is switched, while the magnetization direction in the magnetically harder layer element remains unchanged.

With regard to the question as to whether memory cell configurations having magnetoresistive memory elements will become technologically important, one significant factor, among others, is whether such memory cell configurations can be produced using a semiconductor process technique. Neither this problem nor possible solutions have so far been described in the literature.

SUMMARY OF THE INVENTION

It is accordingly an object of the invention to provide a memory cell configuration and a method for its production which overcome the hereinafore-mentioned disadvantages of the heretofore-known memory cell configurations and their methods of production of this general type.

The present invention concerns specifying a memory cell configuration having magnetoresistive memory elements which can be produced using a semiconductor process technique, and a method for producing a memory cell configuration having magnetoresistive memory elements using a semiconductor process technique.

This problem is solved by a memory cell configuration having a cell array which has first lines, second lines, and a peripheral area and is disposed in the form of a grid in a first plane; first magnetoresistive memory elements in the cell array disposed between the first lines and the second lines for addressing said magnetoresistive memory elements; at least one first metalization plane, one second metalization plane and contacts in the peripheral area of the cell array, the contacts providing local electrical connections between the first metalization plane and the second metalization plane. The first lines and the first metalization plane are in the same plane for making contact with one another, and the second lines and the contacts are disposed in the same plane.

In one embodiment of the memory cell configuration an intermetal dielectric surrounds the second lines and contacts.

In another embodiment of the memory cell configuration the first lines and the first metalization plane have substantially the same thickness.

In another embodiment of the memory cell configuration the third lines in the cell array and the second metalization plane are in the same plane, and second magnetoresistive memory elements are disposed in a second plane between the second lines and the third lines.

In another embodiment of the memory cell configuration the third lines and the second metalization plane have essentially the same thickness.

In another embodiment of the memory cell configuration the magnetoresistive memory element has a first ferromagnetic layer, a non-magnetic layer and a second ferromagnetic layer, the first ferromagnetic layer and the second ferromagnetic layer contain one of Fe, Ni, Co, Cr, Mn, Gd and Dy and each have a thickness in a range between 2 nm and 20 nm, and the non-magnetic layer contains $Al_2O_3$, NiO, $HfO_2$, $TiO_2$, NbO, SiO2, Cu, Au, Ag or Al and has a thickness of between 1 nm and 5 nm.

In another embodiment of the memory cell configuration there is a diffusion barrier between the first lines and the first magnetoresistive memory elements, between the first magnetoresistive memory elements and the second lines, between the second lines and the second magnetoresistive memory elements, and between the second magnetoresistive memory elements and the third lines.

In another embodiment of the memory cell configuration the first lines and the second lines in the cell array contain one of Al, Cu, W and a silicide.

This problem is solved by a method for producing such a memory cell with the following production steps: forming a first line in a cell array on one main surface of a semiconductor substrate by deposition and structuring of a first conductive layer; producing a first metalization plane in a peripheral area; providing first magnetoresistive memory elements in the cell array, each magnetoresistive memory element connected to one of the first lines; forming second lines by depositing and structuring of a second conductive layer in the cell array, the second lines connected to the first magnetoresistive memory elements; forming contacts connected to the first metalization plane in the peripheral area, and forming a second metalization plane by depositing and structuring of a third conductive layer in the peripheral area, the second metalization plane being connected to the contacts.

Another embodiment of the method of producing a memory cell configuration has the additional steps of producing a first insulating layer on the main surface of the semiconductor substrate; producing a first trench in the first insulating layer with a geometric shape corresponding to a geometric shape of the first lines and of the first metalization plane; forming the first lines and the first metalization plane by filling the first trenches with the first conductive layer and planarizing the first trenches for exposing the surface of the first insulating layer; producing a second insulating layer after producing the first magnetoresistive memory elements; forming second trenches having a geometric shape corresponding to a geometric shape of the second lines and of the contacts; filling the second trenches with the second conductive layer, and planarizing the second trenches for exposing a surface of a second insulating layer to form the second lines and the contacts; producing a third insulating layer having third trenches formed therein with a geometric shape corresponding to a geometric shape of a second metalization plane; and filling the third trenches with the third conductive layer and planarizing the third trenches for exposing a surface of the third insulating layer to form the second metalization plane.

Another embodiment of the method of producing a memory cell configuration has the additional steps of forming second magnetoresistive memory elements and connecting each after forming the second lines and the contacts, and connecting each one of the second magnetoresistive memory elements to one of the second lines.

Another embodiment of the method of producing a memory cell configuration has the additional steps of forming second lines and connecting the second lines to the second magnetoresistive elements during the structuring of the third conductive layer in the cell array.

Another embodiment of the method of producing a memory cell configuration has the additional steps of producing a first insulating layer on the main surface of a semiconductor substrate and forming first trenches in the first insulating layer having a geometric shape corresponding to a geometric shape of the first lines and of the first metalization plane; filling and planarizing the first trenches with the first conductive layer for exposing a surface of the first insulating layer to form the first lines and the first metalization plane; producing a second insulating layer after forming the first magnetoresistive elements, and producing second trenches in the second insulating layer having a geometric shape corresponding to a geometric shape of the second lines and of the contacts; filling and planarizing the second trenches with the second conductive layer for exposing a surface of the second insulating layer to form the second lines and the contacts; producing a third insulating layer after forming the second magnetoresistive memory elements, and forming third trenches having a geometric shape corresponding to a geometric shape of the third lines and of the second metalization plane; and filling and planarizing the third trenches with the third conductive layer for exposing a surface of the third insulating layer to form the third line and the second metalization plane.

The memory cell configuration includes a first magnetoresistive memory elements in a cell array, which are disposed in the form of a grid and are each disposed between a first line and a second line. A large number of first lines and second lines are provided. At least one first metalization plane and one second metalization plane are provided in a peripheral area, and are electrically connected to one another via contacts. Such contacts between metalization planes are normally referred to as vias or via connections in the prior art. The contacts are disposed between the first metalization plane and the second metalization plane. The first lines and the first metalization plane are disposed in one and the same plane. The second lines and the second contacts are likewise disposed in one and the same plane. Thus, both the first lines and the first metalization plane as well as the second lines and the contacts may each be produced from a conductive layer by an appropriate structuring.

Since the first lines are disposed in the same plane as the first metalization plane, and the second lines are disposed in the same plane as the contacts, the vertical distance between the first lines and the second lines can be varied independently of the vertical distance between the first metalization plane and the second metalization plane. This has the advantage that the distance between the first lines and the second lines can be matched to the circumstances in the cell array, without affecting the situation in the peripheral area.

As described in the context of the prior art, information is written to one of the magnetoresistive memory elements by applying a magnetic field. The magnetic field is induced by a current flowing through the associated first and second lines. Since the magnitude of the magnetic field depends on the current intensity of the current flowing and on the distance from the conductor through which the current flows, with the magnetic field rising as the current intensity rises and falling as the distance rises, it is desirable to dispose the first lines and the second lines in the vicinity of the magnetoresistive memory elements. Furthermore, it is advantageous to connect each of the magnetoresistive memory elements between two lines since it is then also possible to assess the resistance of the magnetoresistive memory element, which corresponds to the stored information, via these lines. Depending on the thickness of the magnetoresistive memory elements in the cell array, it is desirable to achieve a maximum distance of 20 to 40 nm between first lines and second lines disposed one above the other.

The vertical distance between the first metalization plane and the second metalization plane in the peripheral area must, in contrast, be considerably greater in order to reduce parasitic capacitances between the first metalization plane and the second metalization plane, and for reasons relating to the process. It is typically 350 to 400 nm when using 0.35 $\mu$m technology.

The provision of the first lines in the same plane at the first metalization plane, and of the second lines in the same plane as the contacts, thus makes it possible to produce a different distance between the first lines and the second lines in the cell array than in the peripheral area between the first metalization plane and the second metalization plane, so that it is possible to vary the short distance required to achieve low current intensities for writing information by varying the magnetization state of the magnetoresistive element in the cell array, while it is possible to maintain the vertical distance, which is larger by about one order of magnitude, between the metalization planes in the peripheral area as required in terms of parasitic capacitance and technology. At the same time, the first lines and the second lines can be produced together with the structures in the peripheral area. No additional deposition steps, lithography or structuring steps are therefore required for producing the first lines and second lines. The production of the memory cell configuration is thus simplified.

The first lines and the first metalization plane preferably have essentially the same thickness. The second lines and the contacts are surrounded by an intermetal dielectric and terminate essentially at the same level as the intermetal dielectric. This refinement of the invention has a planar surface, which is advantageous in terms of further processing and becomes increasingly important as the structure sizes decrease.

According to a further refinement of the invention, third lines are provided in a cell array, and are disposed above the second lines. Second magnetoresistive memory elements are disposed between the second lines and the third lines, once again with one of the second lines and one of the third lines in each case being associated with one of the second magnetoresistive memory elements. The third lines are disposed in the same plane as the second metalization plane in the peripheral area. In this refinement of the invention, a higher packing density of the memory element is achieved in the cell array, since they are disposed in two planes one above the other. The area required for each memory element thus falls by a factor of 2. In terms of making it easier to drive the cell array, it is in this case advantageous to provide the first magnetoresistive memory elements and the second magnetoresistive memory elements from the same material and with the same characteristics. The characteristics of the first magnetoresistive memory elements and of the second magnetoresistive memory elements may, however, also differ if their application makes this necessary.

Furthermore, it is possible for the memory cell configuration to have further planes with magnetoresistive elements and lines disposed above them, thus resulting in a three-dimensional configuration of the magnetoresistive memory cells with a high packing density. The odd-numbered planes are in this case constructed in an analogous manner to the first lines, the first magnetoresistive elements and the second lines, while the even-numbered planes are constructed analogously to the second lines, the second magnetoresistive elements and the third lines.

With regard to the planarity of the configuration, it is advantageous to provide the third lines and the second metalization plane such that they have essentially the same thickness.

To produce the memory cell configuration, the third lines and the second metalization plane are preferably formed by deposition and structuring of a common, conductive layer.

In order to produce the memory cell configuration with a high level of planarity, it is advantageous to produce the conductive layers (from which the first lines and the first metalization plane, the second lines and the contacts as well as the third lines and the second metalization plane are formed by structuring) by use of planarizing structuring methods. The deposition of insulating layers is particularly suitable for this purpose, in which trenches are produced in the form of the conductive structures which will be produced later, and for these trenches to be filled. Alternatively, the conductive structures can be formed by structuring a conductive layer using lithography and etching methods, with these conductive structures subsequently being surrounded by insulating material, which is structured by deposition and planarization, for example by chemical/mechanical polishing.

The magnetoresistive memory elements each have a first ferromagnetic layer, a non-magnetic layer and a second ferromagnetic layer, with the non-magnetic layer being disposed between the first ferromagnetic layer and the second ferromagnetic layer. The magnetoresistive memory elements can thus be based both on the GMR effect and on the TMR effect. The use of magnetoresistive memory elements which are based on the TMR effect is preferable since the relative resistance change is greater than that with the GMR effect. Furthermore, the higher resistance of the TMR elements is better since the power consumption is lower. In addition, the magnetoresistive memory elements can be based on the CMR effect, provided the configuration can cope with the currents required for switching strong magnetic fields.

The first ferromagnetic layer and the second ferromagnetic layer preferably contain at least one of the elements Fe, Ni, Co, Cr, Mn, Gd, Dy and they have a thickness of between 2 nm and 20 nm. The first ferromagnetic layer and the second ferromagnetic layer have different magnetic hardnesses and/or geometric dimensions.

The non-magnetic layer contains at least one of the materials $Al_2O_3$, NiO, $HfO_2$, $TiO_2$, NbO, $SiO_2$, and has a thickness of between 1 nm and 4 nm, when using the TMR effect. For the GMR effect, the non-magnetic layer contains at least one of the materials Cu, Au, Ag and/or Al, and has a thickness of between 2 nm and 5 nm.

The magnetoresistive memory elements have any desired cross section parallel to the line planes. A cross section may, in particular, be rectangular, round, oval, polygonal or annular.

In order to avoid diffusion between the magnetoresistive memory elements and adjacent lines during production and/or operation of the memory cell configuration, it is advantageous to provide a diffusion barrier between each of the magnetoresistive memory elements and the adjacent lines. This effect is particularly important if the lines in the cell array contain Cu, Ag or Au.

Alternatively or additionally, the lines may contain tungsten or metal silicide.

Other features which are considered as characteristic for the invention are set forth in the appended claims.

Although the invention is illustrated and described herein as embodied in a memory cell configuration, and a method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 4 to 10 are partial sectional views showing steps in the production of a memory cell configuration.

DESCRIPTION OF THE PREFERRED EMBODIMENTS

Figure 1:
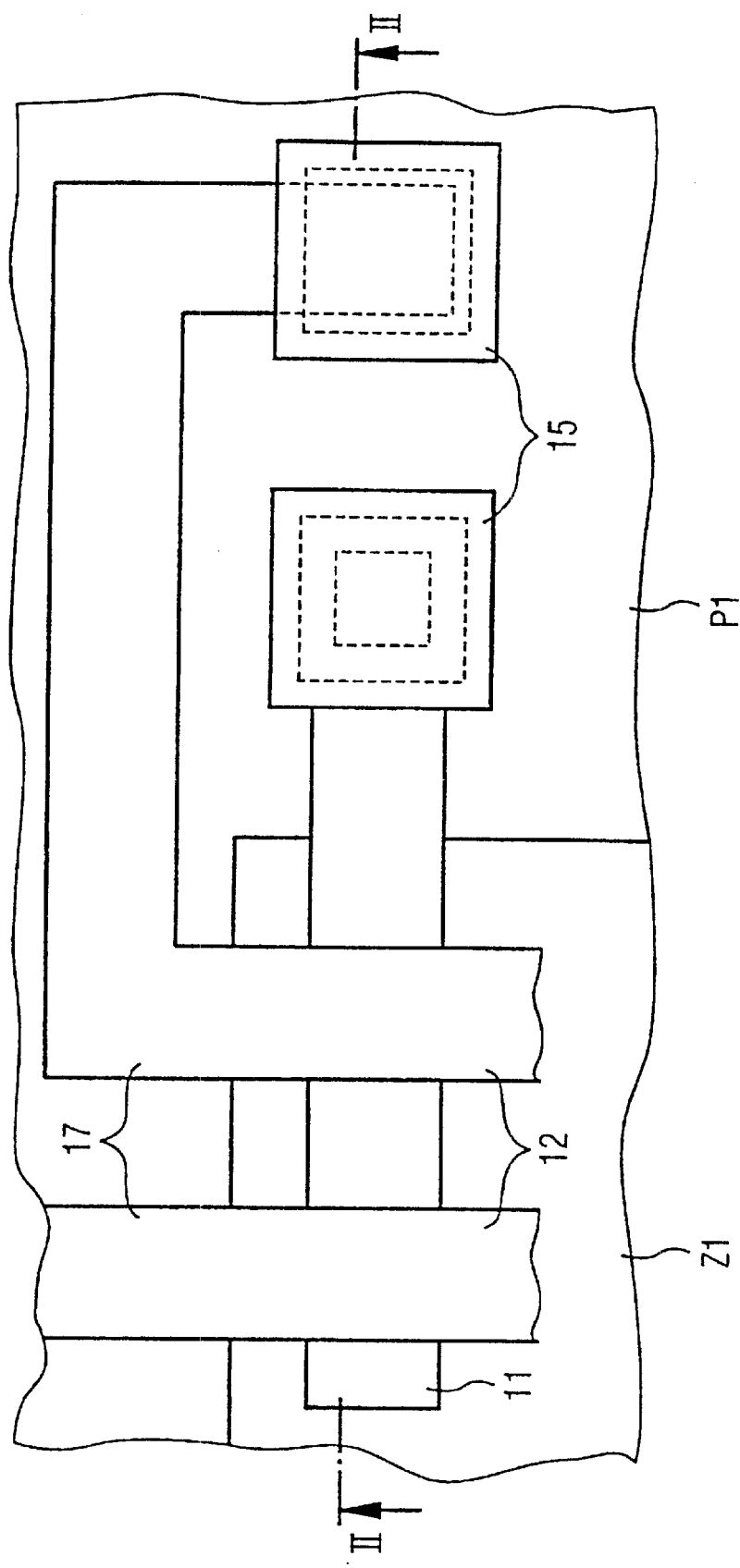
FIG. 1 is a plan view of a memory cell configuration at the interface between the memory cell array and the peripheral area.
Figure 2:
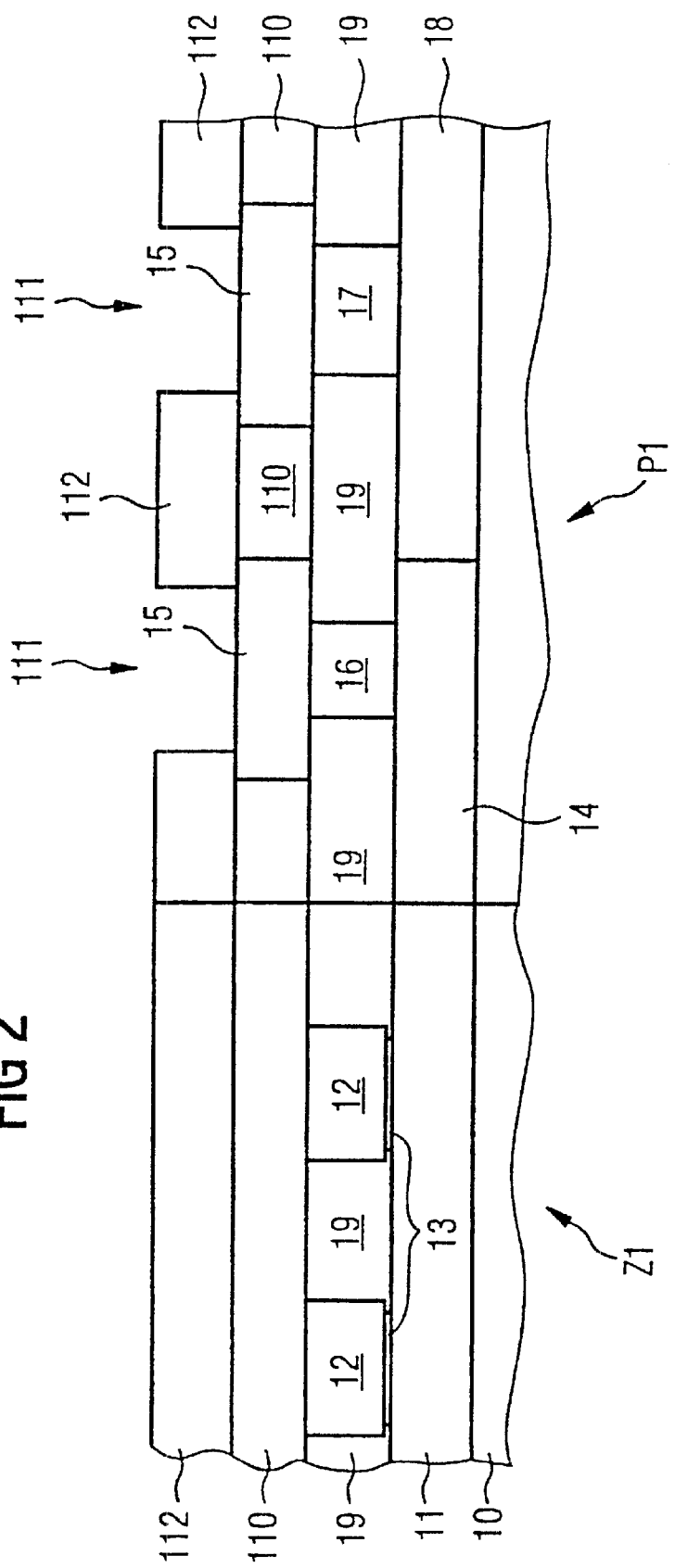
FIG. 2 is a sectional view through a memory cell configuration as annotated by the line II—II in FIG. 1.

Referring now to the figures of the drawings in detail and first, particularly to FIGS. 1 and 2, thereof, there is seen a memory cell configuration which has a cell array Z1 and a peripheral area P1. The area of the cell array Z1 and the peripheral area P1 are separated from one another in FIG. 2 by a vertical, solid line. First lines 11 and second lines 12 are disposed in the cell array Z1. The first lines 11 are disposed on the surface of a semiconductor substrate 10. The semiconductor substrate 10 is composed of monocrystalline silicon and, in the peripheral area P1 and/or under the cell array, contains components which are required to drive the cell array Z1.

The first lines 11 and the second lines 12 cross one another. A magnetoresistive element 13 is disposed in each area where one of the first lines 11 (for reasons of clarity, only one first line 11 is shown in FIG. 1 and FIG. 2) crosses one of the second lines 12.

A first metalization plane 14 and a second metalization plane 15 are disposed in the peripheral area P1. The second metalization plane 15 is disposed above the first metalization plane 14 and is electrically connected to the first metalization plane 14 via contact 16 (for the sake of clarity, FIG. 2 shows only one contact 16). Furthermore, connecting lines 17 are disposed in the peripheral area P1, and are connected to the second lines 12 in the cell array Z1.

The first metalization plane 14 is disposed in one and the same plane with the first lines 11. The first metalization plane 14 is thus also disposed on the surface of the semiconductor substrate 10. The first lines 11 and the first metalization plane 14 are embedded in a first insulation structure 18, with which they form a planar surface. The second lines 12, the contacts 16 and the connecting lines 17 are disposed in a plane above the first lines 11, the first metalization plane 14 and the first insulation structure 18. The magnetoresistive memory elements 13, the second lines 12, the contacts 16 and the connecting lines 17 are surrounded by a second insulation structure 19, with which the second lines 12, the contact 16 and the connecting lines 17 form a planar surface.

The second metalization plane 15 is disposed above this and is surrounded by a third insulation structure 110, with which it forms a planar surface.

Both the first lines 11 and the second lines 12 can be contacted via the second metalization plane 15. Firstly, the first lines 11 are connected to the first metalization plane 14, which is connected via contacts 16 to the second metalization plane 15, and, secondly, the second lines 12 are connected via the connecting lines 17 to the second metalization plane. Contact is made with the second metalization plane 15 via contact holes 111 in a passivation layer 112 composed of $SiO_2$ or $SiO_2$ and $Si_3N_4$. The first insulation structure 18, the second insulation structure 19 and the third insulation structure 110 are composed of a material which is suitable for intermetal dielectrics, in particular $SiO_2$, $Si_3N_4$, organic or porous inorganic dielectrics. The vertical distance between the first lines and the second lines 12 corresponds to the thickness of the magnetoresistive memory elements 13 and is 20 to 30 nm. The distance between the first metalization plane 14 and the second metalization plane 15 corresponds to the height of the contacts 16 and is 350 to 400 μm.

Figure 3:
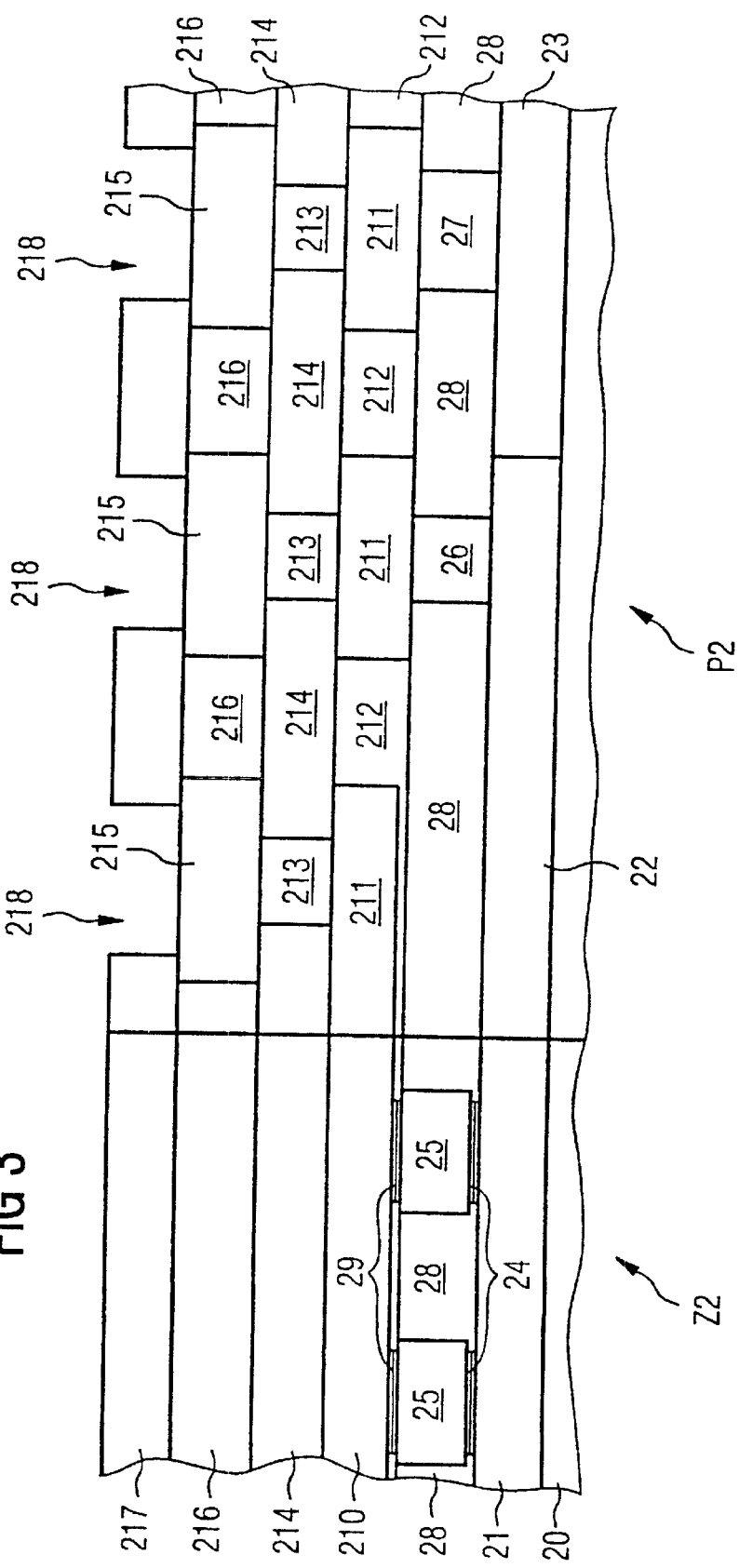
FIG. 3 is a sectional view through a memory cell configuration which has magnetoresistive memory elements in two planes disposed one above the other, at the interface between the memory cell array and the peripheral area.

FIG. 3 shows a memory cell configuration which has a cell array Z2 and a peripheral area P2 separated from one another by a vertical, solid line. First lines 21 are disposed in a cell array Z2 on the surface of a semiconductor substrate 20 which contains monocrystalline silicon, and a first metalization plane 22 is disposed in a peripheral area P2. The first lines 21 are connected to the first metalization plane 22. The first lines 21 and the first metalization plane 22 are surrounded by a first insulation structure 23, with which they have a planar surface.

First magnetoresistive memory elements 24 are disposed on the surface of the first lines 21, and second lines 25 are disposed above them. The second lines 25 cross the first lines 21. First contacts 26 and connecting lines 27 are disposed in the peripheral area P2 in the same plane as the second lines 25 in the cell array Z2. The connecting lines 27 are connected to the second lines 25 in the cell array Z2 (outside the plane of the drawing shown in FIG. 3). The second lines 25, the first contacts 26 and the connecting lines 27 are formed by structuring of a conductive layer composed Al, Cu, W, silicides, and are surrounded by a second insulation structure 28, and they terminate at the same height as this second insulation structure 28.

Second magnetoresistive memory elements 29 are disposed on the surface of the second lines 25 in the cell array Z2 and their geometric shape and material composition correspond to those of the first magnetoresistive memory elements 24. Third lines 210 are disposed in the cell array Z2 above the second magnetoresistive memory elements 29, and are connected to said second magnetoresistive memory elements 29. A second metalization plane 211 is disposed in the peripheral area P2, in the same plane as the third lines 210. The second metalization plane 211 is connected both to the first contacts 26 and to the connecting lines 27. The third lines 210 and the second metalization plane 211 are formed by structuring of a conductive layer composed of Al, Cu, W or silicides in a common production step.

The third lines 210, the second magnetoresistive memory elements 29 and the second metalization plane 211 are surrounded by a third insulation structure 212, with which the third lines 210 and the second metalization plane 211 form a planar surface.

Second contacts 213 are disposed above the second metalization plane 211 and are connected to said second metalization plane 211. The second contacts 213 are surrounded by a fourth insulation structure 214, with which they form a planar surface. A third metalization plane 215 is disposed on this surface and is surrounded by a fifth insulation structure 216, with which it forms a planar surface. Contact holes 218, via which contact can be made with the third metalization plane 215, are provided in a passivation layer 217 which is disposed above the fifth insulation structure 216 and the third metalization plane 215.

FIGS. 4 to 10 show the production of a memory cell configuration using a three-layer process.

FIG. 4 shows a cell array Z and a peripheral area P marked by a dashed vertical line. A first $SiO_2$ layer 41 with a thickness of 50 to 100 nm, a first $Si_3N_4$ layer 42 with a thickness of 30 to 50 nm and a second $SiO_2$ layer 43 with a thickness of 400 to 800 nm are applied to the surface of a semiconductor substrate 40 composed of silicon. A resist mask (not shown) and anisotropic etching are used to structure the second $SiO_2$ layer 43, so that the surface of the first $Si_3N_4$ layer 42 is partially exposed. In the process, a first trench 44 is produced at the side of the second $SiO_2$ layer 43. The first trench 44 has a cross section parallel to the surface of the substrate 40 which governs the shape of first lines, which will be produced later, and of a first metalization plane.

FIG. 5 shows a deposited first TaN/Ta layer 45 with a thickness of approximately 50 nm and a first copper layer 46 with a thickness such that the first trench 44 is filled, followed by chemical/mechanical polishing except for the surface of the second $SiO_2$ layer 43 result in the formation of the first line, which is embedded in the trench 44, and of the third metalization plane. A first barrier layer 47 composed of Ta, Ti, W, Mo or Nb with a thickness of 10 to 30 nm, a layer sequence 48 and a second barrier layer 49 with a thickness of 10 to 30 nm and composed of Ta, Ti, W, Mo or Nb are then applied over the entire surface. The layer sequence 48 contains a first ferromagnetic layer composed of Co or Fe, Ni, Cr, Mn, Gd, Dy a non-magnetic layer composed of $Al_2O_3$, NiO, $HfO_2$, $TiO_2$, NbO, $SiO_2$, Cu, Au, Ag or Al, and a second ferromagnetic layer composed of NiFe, Co or Fe, etc. The layer sequence 48 has a thickness of approximately 10 to 20 nm, and is suitable for producing magnetoresistive memory elements.

FIG. 6 shows a structured first barrier layer 47, layer sequence 48 and the second barrier layer 49. A photolithographically structured resist mask (not illustrated) is used as an etching mask to structure the first barrier layer 47, the layer sequence 48 and the second barrier layer 49 by selective anisotropic etching to copper and $SiO_2$, using etching gases containing chlorine and/or fluorine. This results in magnetoresistive memory elements being produced from the layer sequence 48, and these are disposed in the form of a grid.

A third $SiO_2$ layer 411 is then deposited by CVD and is selectively planarized to form the second barrier layer 49 by chemical/mechanical planarization. The third $SiO_2$ layer 411 completely surrounds the magnetoresistive memory elements at the side.

FIG. 7 shows a second $Si_3N_4$ layer 412 applied with a layer thickness of 30 to 50 nm and structured by using a photoresist mask (not illustrated) and anisotropic etching with etching gas mixtures containing fluorine (for example $CF_4/O_2$, $SF_6$/He), so that the surface of the third $SiO_2$ layer 411 is exposed in the peripheral area P. The second $Si_3N_4$ layer 412 thus remains only in the region of the cell array Z, where it covers the second barrier layer 49 and the third $SiO_2$ layer 411.

FIG. 8 shows the following steps. A fourth $SiO_2$ layer 413 with a thickness of 400 to 800 nm is deposited on this. A resist mask 414 is produced by photolithographic process steps on the surface of the fourth $SiO_2$ layer 413, and this defines second lines in the area of the cell array Z, and the configuration of contacts in the peripheral area P. In this case, the surface of the fourth $SiO_2$ layer 413 is exposed in those areas in which second lines and contacts will subsequently be formed. The fourth $SiO_2$ layer 413 and the third $SiO_2$ layer in the peripheral area P are structured by anisotropic etching selectively to $Si_3N_4$ using etching gases containing chlorine and fluorine (for example $CHF_3/CF_4$ or $C_4F_8$/CO) using the resist mask 414 as the etching mask. Second trenches 415 are formed in the process. The second trenches 415 are then filled by depositing a second TaN/Ta layer 416 with a thickness of approximately 50 nm and a second copper layer 417 with a thickness of 300 to 1000 nm. The minimum thickness of the deposited second copper layer depends on the conformity of the copper deposition process and on the line widths of the trenches to be filled.

FIG. 9 shows the second copper layer 417 and the second TaN/Ta layer 416 being structured by chemical/mechanical polishing. In the process, second lines 418 are formed in the cell array, and contacts 419 and connecting lines 420, which are connected to the second lines 418, are formed in the peripheral layer P.

A third $Si_3N_4$ layer 421 with a thickness of 30 to 50 nm is applied over the entire surface. A fifth $SiO_2$ layer 422 with a thickness of 400 to 800 nm is applied to this layer 421. Third trenches 423 are produced by anisotropic etching with gases containing chlorine and fluorine, using a photolithographically produced resist mask as the etching mask (not illustrated), and are filled with a third TaN/Ta layer 424 and a third copper layer 425. The third TaN/Ta layer 424 is deposited with a thickness of approximately 50 nm, and the third copper layer 425 is deposited with a thickness of 300 to 1000 nm.

Figure 10:
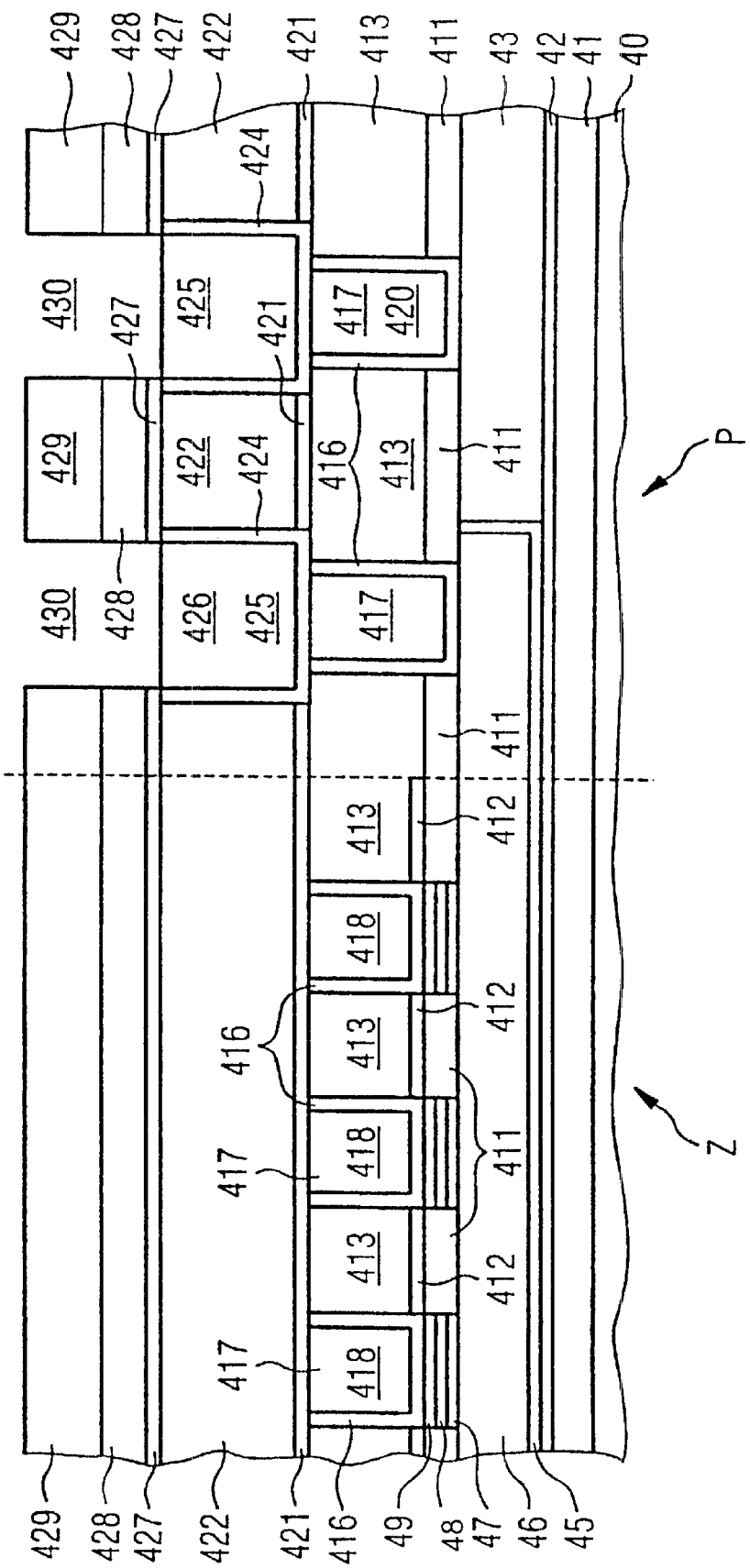

FIG. 10 shows the following steps. The third copper layer 425 and the third TaN/Ta layer 424 are structured by chemical/mechanical polishing. In the process, the surface of the fifth SiO₂ layer 422 outside the third trenches 423 is exposed. A third metalization plane 426 is formed in the third trenches 423. An Si₃N₄ layer 427 with a thickness of 50 nm, a double passivation layer having an SiO₂ layer 428, which is produced with a thickness of 300 nm using a plasma CVD process, and a Si₃N₄ layer 429, which is produced with a thickness of 500 to 600 nm using a plasma CVD process, are deposited on the surface of the fifth SiO₂ layer 422 and of the third metalization plane 426. Contact holes 430, which extend to the third metalization plane 426, are opened in the Si₃N₄ layer 429, in the SiO₂ layer 428 and in the Si₃N₄ layer 427 by using a photolithographically produced mask.

This production process for a memory cell configuration, which is integrated in a three-layer metalization process, can advantageously be modified as follows:

After structuring of the second barrier layer 49, of the layer sequence 48 and of the first barrier layer 47, the third SiO₂ layer 411 is etched back by using an anisotropic RIE process (for example using etching gases containing chlorine and fluorine) such that the memory elements are laterally isolated by SiO₂ spacers. The second Si₃N₄ layer 412 is then deposited as conformally as possible. The fourth SiO₂ layer 413 is deposited, and is planarized by using a short CMP step, without needing to structure the second Si₃N₄ layer 412. Then, as in the process sequence already outlined, the fourth SiO₂ layer 413 is selectively structured with respect to the second Si₃N₄ layer 412, and the second Si₃N₄ layer 412 is selectively structured with respect to the SiO₂ spacers in the layer 411 and with respect to the second SiO₂ layer 43. All the other process steps are identical to those in the process sequence already outlined.

This process modification has the following advantages: firstly, it saves a photolithographic structuring plane. Secondly, the first lines 21 in the cell array Z and in the first metalization plane 22 in the peripheral area P are completely covered by the Si₃N₄ layer 413, and, in conjunction with the first TaN/Ta layer 45, this reduces the diffusion of copper and other mobile elements (for example Ag) out of the first lines 21 into the adjacent SiO₂ layers (413, 412), and thus reduces the degradation of these layers. Thirdly, this reliably prevents exposure of the memory element flanks during the structuring of the second trenches 415, and hence reliably prevents electrical shunt paths around the memory elements.

Figure 11:
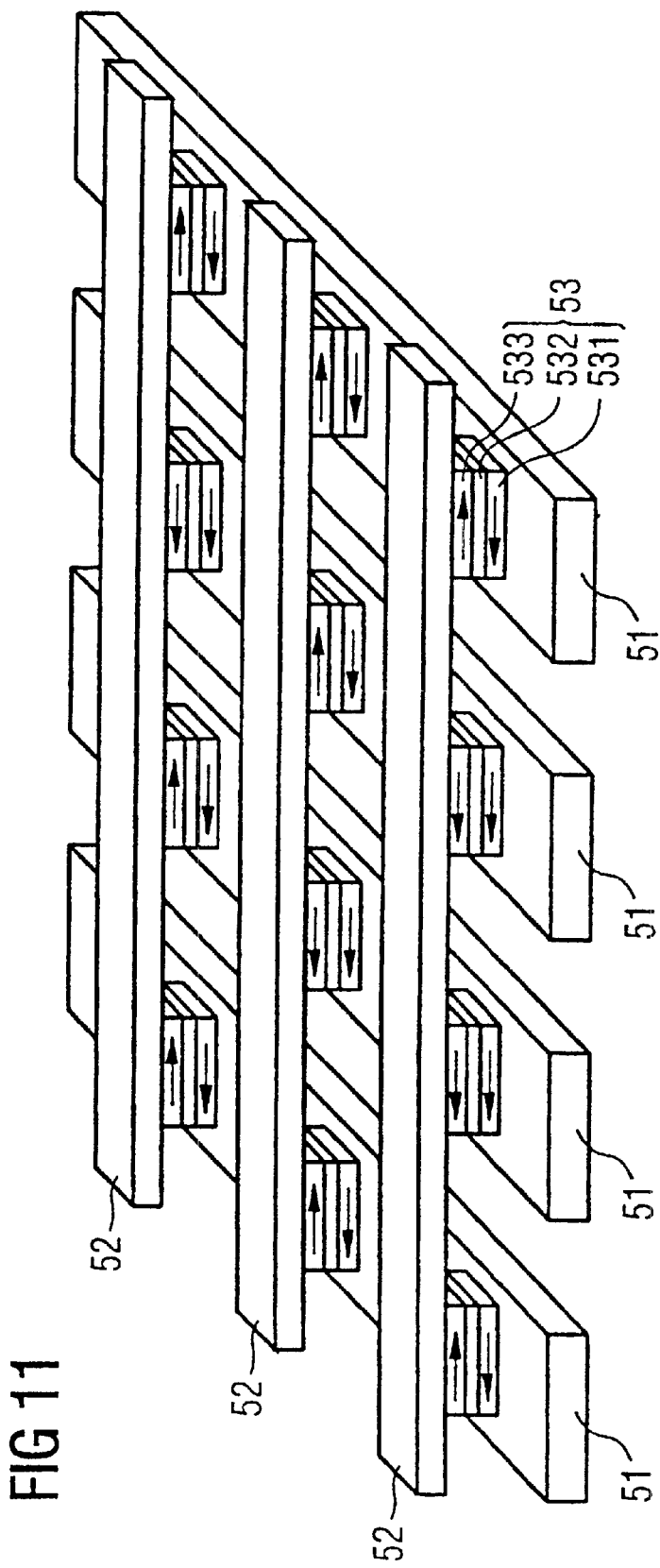
FIG. 11 is a perspective view of a memory cell configuration.

FIG. 11 shows first lines 51, which are in the form of strips and run parallel to one another, and second lines 52 disposed in the cell array of a memory cell configuration. The second lines 52 are likewise in the form of strips and run parallel to one another. The second lines 52 cross the first lines 51. A magnetoresistive memory element 53, which has a first ferromagnetic layer 531, a non-magnetic layer 532 and a second ferromagnetic layer 533, is disposed in each of the crossing areas between one of the first lines 51 and one of the second lines 52. The cross section of the magnetoresistive memory elements 53 is in each case rectangular, elongated hexagonal or elliptical. The lateral dimensions are comparable to the widths of the first lines 51 and second lines 52. The first ferromagnetic layer 531 and the second ferromagnetic layer 533 each have a thickness of 3 to 10 nm. The non-magnetic layer 532 has a thickness of 1 to 3 nm. The first ferromagnetic layer 531 contains cobalt. The non-magnetic layer 532 contains Al₂O₃. The second ferromagnetic layer 533 contains NiFe. The first lines 51 and the second lines 52 each contain copper.

The resistance of the magnetoresistive memory elements 53 depends on the magnetization directions of the first ferromagnetic layer 531 and of the second ferromagnetic layer 533. If the two layers are magnetized parallel to one another, the resistance is less than if they are magnetized parallel but in opposite directions.

We claim:

1. A memory cell configuration, comprising:

a cell array having first lines, second lines, and a peripheral area and being disposed in the form of a grid in a first plane;

first magnetoresistive memory elements in said cell array disposed between said first lines and said second lines for addressing said magnetoresistive memory elements;

at least one first metalization plane, one second metalization plane and contacts in said peripheral area of said cell array, said contacts providing local electrical connections between said first metalization plane and said second metalization plane;

said first lines and said first metalization plane disposed in the same plane for making contact with one another; and said second lines and said contacts disposed in the same plane.

2. The memory cell configuration according to claim 1, further comprising an intermetal dielectric surrounding said second lines and said contacts.

3. The memory cell configuration according to claim 1, wherein said first lines and said first metalization plane have substantially the same thickness.

4. The memory cell configuration according to claim 1, further comprising:

third lines in said cell array, said third lines and said second metalization plane disposed in the same plane; and second magnetoresistive memory elements disposed in a second plane between one of said second lines and one of said third lines.

5. The memory cell configuration according to claim 4, wherein said third lines and said second metalization plane have essentially the same thickness.

6. The memory cell configuration according to claim 1, wherein each of said magnetoresistive memory elements has a first ferromagnetic layer, a non-magnetic layer and a second ferromagnetic layer, said first ferromagnetic layer and said second ferromagnetic layer contain one of Fe, Ni, Co, Cr, Mn, Gd and Dy and each have a thickness in a range between 2 nm and 20 nm, and said non-magnetic layer contains Al₂O₃, NiO, HfO₂, TiO₂, NbO, SiO2, Cu, Au, Ag or Al and has a thickness of between 1 nm and 5 nm.

7. The memory cell configuration according to claim 1, further comprising a diffusion barrier between said first lines and said first magnetoresistive memory elements, between said first magnetoresistive memory elements and said second lines, between said second lines and said magnetoresistive memory elements, and between second magnetoresistive memory elements and said third lines.

8. The memory cell configuration according to claim 1, wherein said first lines and said second lines in said cell array contain one of Al, Cu, W and a silicide.

* * * * *